(12) United States Patent
Takemoto et al.

(10) Patent No.: US 7,714,644 B2
(45) Date of Patent: May 11, 2010

(54) AMPLIFIER CIRCUIT

(75) Inventors: Takashi Takemoto, Kokubunji (JP);
Hiroki Yamashita, Hachioji (JP);
Tatsuya Saito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 30 days.

(21) Appl. No.: 12/166,666

(22) Filed: Jul. 2, 2008

(65) Prior Publication Data
US 2009/0009240 A1  Jan. 8, 2009

(30) Foreign Application Priority Data
Jul. 5, 2007  (JP) ............................... 2007-176931

(51) Int. Cl.
*H03F 1/02* (2006.01)
(52) U.S. Cl. ............................... 330/9; 330/85; 330/293
(58) Field of Classification Search ...................... 330/9, 330/85, 291–293
See application file for complete search history.

(56) References Cited

U.S. PATENT DOCUMENTS 4,276,514 A * 6/1981 Huang .......................... 330/149
5,838,195 A * 11/1998 Szmurlo et al. ............. 330/149
6,486,734 B2 * 11/2002 Oguro et al. ................. 330/151

FOREIGN PATENT DOCUMENTS

JP        07-231227        8/1995

OTHER PUBLICATIONS

"AD8551/AD8552/AD8554", [Online], [Retrieved on May 31, 2006], Internet <URL: http://www.analog.com/UploadedFiles/Data_sheets/AD8551_AD8552_8554.pdf>.

* cited by examiner

*Primary Examiner*—Khanh V Nguyen
(74) *Attorney, Agent, or Firm*—Antonelli, Terry, Stout & Kraus, LLP.

(57) ABSTRACT

An amplifier circuit block and a compensation circuit block are provided. The amplifier circuit block includes an analog adder for subtracting an output signal of the compensation circuit block from an input signal and an amplifier circuit operating in a wide band. The compensation circuit block includes an amplifier circuit with a low offset voltage and a low noise in a low frequency region, an analog adder block for subtracting an output signal of the amplifier circuit from an output signal of the amplifier circuit and generating a differential signal thereof, and a feedback circuit block for negatively feeding back the differential signal to the analog adder. The amplifier circuit block can reduce the offset voltage and the low-band noise by the negative feedback of the differential signal, and at the same time, the operation band of the entire amplifier circuit can be decided by the characteristic of the amplifier circuit.

18 Claims, 12 Drawing Sheets

AMPLIFIER CIRCUIT

CROSS-REFERENCE TO RELATED APPLICATION

The present application claims priority from Japanese Patent Application No. JP 2007-176931 filed on Jul. 5, 2007, the content of which is hereby incorporated by reference into this application.

TECHNICAL FIELD OF THE INVENTION

The present invention relates to a wideband amplifier circuit for amplifying a wideband signal. In particular, the present invention relates to a circuit technology effective for reducing an input offset voltage and a low-frequency noise component due to a 1/f noise of the amplifier circuit.

BACKGROUND OF THE INVENTION

Amplifier circuits for medical equipment, biosensors, tape drives and others are required to perform an amplification operation of several mV in a signal level and several hundreds MHz from the direct current in an operation bandwidth, and also need to amplify a signal of the wide-band frequency range in a low-noise level. The amplifier circuit has high input offset voltage generated by device variation and also high noise level on a low-band side due to the effect of the 1/f noise, and in particular, the characteristics of the amplifier circuit in a low frequency range are deteriorated. In general, as the technology for achieving the low offset voltage and the reduction of the 1/f noise in the amplifier circuit, the following conventional technologies have been known.

For example, FIG. 10 shows an amplifier circuit disclosed in Japanese Patent Application Laid-Open Publication No. 7-231227 (Patent Document 1) in which an output offset voltage is suppressed to be small in a wideband amplifier circuit. In the configuration thereof, an amplifier circuit 1001 with a high gain G1 and a low offset voltage is provided on a preceding stage and an amplifier circuit 1002 with a low gain G2 and a high offset voltage and operating in a wide band is provided on a subsequent stage, these circuits are connected in cascade, and negative feedback is applied from an output of the amplifier circuit 1002 to the amplifier circuit 1001. Hence, the offset voltage of the amplifier circuit 1002 of the subsequent stage is compressed by G2/G1 by the gain of the amplifier circuit 1001 of the preceding stage. Further, the gain is decided by a ratio of the negative feedback resistance on the low-band side and decided by the gain G2 of the amplifier circuit 1002 of the subsequent stage on the high-band side. Consequently, if a ratio of negative feedback resistance {R3 (R1+R2)}/{R2(R3+R4)} is set so as to be equal to the gain G2 of the amplifier circuit 1002 of the subsequent stage, a constant gain can be obtained over the wide band.

Furthermore, for example, FIG. 11 shows an amplifier circuit disclosed in "AD8551/AD8552/AD8554", [Online], [Retrieved on May 31, 2006], Internet <URL: http://www.analog.com/UploadedFiles/Data_sheets/AD8551_8552_855 4.pdf> (Non-Patent Document 1) in which a low offset voltage is achieved by using an auto-zero operation function. The configuration thereof includes two amplifier circuits such as a main amplifier circuit 1101 and a nulling amplifier circuit 1102 that compensates the offset voltage of the main amplifier circuit 1101, and each of the amplifier circuits 1101 and 1102 is a summing amplifier circuit having three input terminals. The amplifier circuit of FIG. 11 has two operation modes such as an auto-zero operation and an input signal amplification operation decided by two sets of switch operations. At the time of the auto-zero operation, each switch is connected to the $\Phi 1$ side, and an offset compensation by the auto-zero function of the nulling amplifier circuit 1102 is performed. Next, at the time of the input signal amplification operation, each switch is connected to the $\Phi 2$ side, and the input signal is amplified by the product of the gains of the offset-compensated nulling amplifier circuit 1102 and the main amplifier circuit 1101, and both the offset voltages of the main amplifier circuit and the nulling amplifier circuit are compressed by the gain of the nulling amplifier circuit.

SUMMARY OF THE INVENTION

Incidentally, with respect to the technology for achieving the reduction of a low-band noise component due to the input offset voltage and the 1/f noise of the amplifier circuit as described above, the following has become clear.

In the conventional example of FIG. 10, the offset voltage of the amplifier circuit is compressed by G2/G1. Assuming that the amplifier circuit 1002 has the offset voltage of 1 mV, if the amplification function of a ten-fold gain is to be achieved with the input voltage offset of 1 $\mu$V, the amplifier 1001 requires a 10000-fold gain. Hence, thermal noises of negative feedback resistors R1, R2, R3 and R4 are also amplified by 10000-fold, and the less noise cannot be achieved. Therefore, the conventional example of FIG. 10 can sufficiently achieve the input offset voltage of several mV, but a low offset at the level of several $\mu$V is difficult to achieve.

Further, in the conventional example of FIG. 11, although an input offset voltage of several $\mu$V can be realized by the auto-zero function, since the gain of the amplifier circuit differs at the time of the auto-zero operation and at the time of the input signal operation, a continuous amplification cannot be performed as it is. For the achievement of the continuous amplification, for example, it becomes necessary to provide a low pass filter and the like for the output of the amplification circuit so as to interpolate each discrete output obtained at the time of the input signal operation. However, because of the presence of the low pass filter, an amplifiable operation bandwidth drops by one or more orders of magnitude, and it becomes difficult to achieve a wideband amplification function.

Therefore, an object of the present invention is to provide an amplifier circuit with a low offset voltage and a low noise level. Further, another object of the present invention is to provide an amplifier circuit capable of continuously amplifying a wideband signal with a constant gain. The above and other objects and novel characteristics of the present invention will be apparent from the following detailed description and the accompanying drawings.

The typical ones of the inventions disclosed in this application will be briefly described as follows.

The amplifier circuit of the present invention has an amplifier circuit block and a compensation circuit block serving as means for reducing an offset voltage and noise in a low frequency region of the amplifier circuit block. The amplifier circuit block includes: a first analog adder for subtracting an output signal of the compensation circuit block from a first input signal; and a first amplifier circuit operating in a wide bandwidth. The compensation circuit block includes: a second amplifier circuit which amplifies the first input signal and has the characteristics of a low offset voltage and low noise in a low frequency region; an analog adder block which subtracts an output signal of the second amplifier circuit from an output signal of the first amplifier circuit and generates a differential signal between the first amplifier circuit and the second amplifier circuit; and a feedback circuit block serving as means for applying a negative feedback of the differential signal to the amplifier circuit block.

With the configuration as described above, since the input signal is always amplified by the amplifier circuit block, it is possible to continuously amplify the wideband signal with a constant gain. Further, the gain of the amplifier circuit in the amplifier circuit block receiving the wideband signal component as an input and the gain of the amplifier circuit in the compensation circuit block are equal to each other, and the offset voltage of the latter amplifier circuit is small and the latter amplifier circuit has a low noise in a low frequency region. Therefore, a differential signal is generated from the output signals of the two amplifier circuits with respect to the low-band component, so that the offset voltage and the noise component in a low frequency region of the former amplifier circuit can be detected. Consequently, by applying the negative feedback of this detected signal to the former amplifier circuit, the offset voltage and the low-band noise component of the first amplifier circuit in the amplifier circuit block can be canceled out.

Note that the second amplifier circuit can be realized by, for example, a chopper amplifier circuit, an auto-zero amplifier circuit and the like. Here, in the case where the auto-zero amplifier circuit is used, when detecting a differential signal by the analog adder block, it is necessary to align the difference between the continuous amplification by the first amplifier circuit and a discrete amplification by the auto-zero amplifier circuit. This problem can be solved by providing a low pass filter at the preceding stage of the analog adder block, by providing a switch synchronizing with the operation mode of the auto-zero amplifier circuit at the preceding stage of the first amplifier circuit side of the analog adder block, or by using a ping-pong type auto-zero amplifier circuit in which each operation mode is complementarily switched by two auto-zero amplifier circuits.

The effects obtained by typical aspects of the present invention will be briefly described below. That is, an amplifier circuit with a low offset voltage and a low noise can be realized. Further, an amplifier circuit capable of continuously amplifying a wideband signal with a constant gain can be realized.

BRIEF DESCRIPTIONS OF THE DRAWINGS

DESCRIPTIONS OF THE PREFERRED EMBODIMENTS

In the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference numbers throughout the drawings for describing the embodiment, and the repetitive description thereof will be omitted.

First Embodiment

Figure 1:
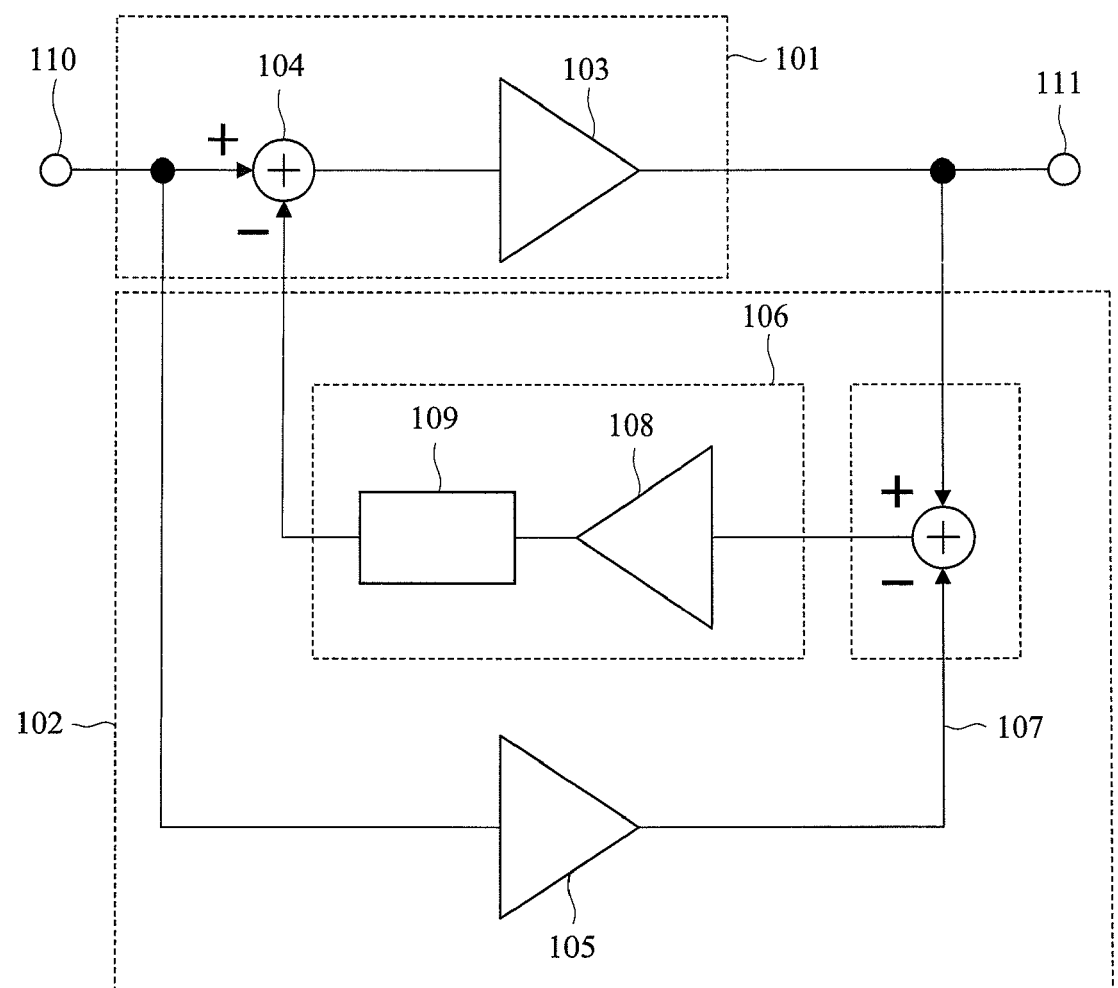
FIG. 1 is a circuit diagram showing a configuration example of an amplifier circuit according to a first embodiment of the present invention.

FIG. 1 is a circuit diagram showing a configuration example of an amplifier circuit according to a first embodiment of the present invention. The amplifier circuit of the first embodiment includes an amplifier circuit block 101 and a compensation circuit block 102 for reducing an offset voltage and a low-band noise of the amplifier circuit block 101. The amplifier circuit block 101 is constituted of an amplifier circuit 103 of the wideband operation and an analog adder 104 for subtracting an offset and a low-band noise of the amplifier circuit 103 by using an output from the compensation circuit block 102.

Further, the compensation circuit block 102 is constituted of an amplifier circuit 105 which has small offset voltage and small low-band noise level and also a gain equal to that of the amplifier circuit 103, an analog adder block 107 for subtracting an output of the amplifier circuit 105 from an output of the amplifier circuit block 101, thereby generating a differential signal, and a feedback circuit block 106 for amplifying and outputting the differential signal to the analog adder 104 of the amplifier circuit block 101. Further, the feedback circuit block 106 is constituted of an amplifier circuit 108 and a low pass filter 109.

As described above, the amplifier circuit of FIG. 1 achieves a wideband amplification operation by using a wideband amplifier circuit for the amplification circuit 103 of the amplification circuit block 101, and achieves a low offset voltage and a low noise by canceling out the offset voltage and the low-band noise of the amplifier circuit 103 by using the compensation circuit block 102. More specifically, these effects can be achieved by the following mechanism.

In the analog adder block 107, the gain of the amplifier circuit 103 and the gain of the amplifier circuit 105 are equal to each other, and the amplifier circuit 105 is an amplifier circuit with a low offset voltage and a low noise. Therefore, the analog adder block 107 outputs the offset voltage and the noise component of the amplifier circuit 103. Further, the feedback circuit block 106 amplifies the output signal of the analog adder block 107 and allows it to pass through the low pass filter 109, thereby extracting only the offset voltage and the low-band noise component of the amplifier circuit 103. As a result, in the amplifier circuit of FIG. 1, a low-band signal component, that is, the offset voltage and the low-band noise component of the amplifier circuit 103 only are negatively fed back to the amplifier circuit 103. Therefore, a wideband signal can be amplified with a low offset and a low noise. Further, in the present first embodiment, further effect can be expected by using an amplifier circuit with a low offset and a low noise for the amplifier circuit 108.

Here, the effect of the amplifier circuit of FIG. 1 will be quantitatively described. When the gains of the amplifier circuits 103, 105 and 108 are defined as G1, G2 and G3, respectively, a transfer function of the low pass filter 109 is defined as $H(\omega)$, the input signal of an input signal node 110 is defined as VI, the output signal of an output signal node 111 is defined as VO, the offset voltages of the amplifier circuits 105 and 108 are set small, and the effect of only the offset voltage Voff1 of the amplifier circuit 103 is considered, the output signal VO is expressed by the formula 1 below.

$$VO = G1 \left\{ \left( \frac{1 + G2G3(\omega)}{1 + G1G3(\omega)} \right) VI + \frac{Voff1}{1 + G1G3H(\omega)} \right\} \quad \text{[Formula 1]}$$

Here, assuming that the gains of the amplifier circuits 103 and 105 are the same (G1=G2), the output of the amplifier circuit is expressed by the formula 2 below.

$$VO = G1 \left( VI + \frac{Voff1}{1 + G1G3H(\omega)} \right) \quad \text{[Formula 2]}$$

The input signal is constantly amplified by the gain G1, and an effective input offset voltage of the amplifier circuit 103 is compressed approximately by 1/(G1G3). Hence, a low-offset and low-noise signal amplification can be achieved. For example, assuming that the gain of the amplifier circuit 103 is hundred-fold, the gain of the amplifier circuit 108 is ten-fold, and the offset voltage of the amplifier circuit 103 is 1 mV, the effective input offset voltage Voff_eff of the amplifier circuit of FIG. 1 can be expressed as Voff_eff=1 mV/100×10=1 μv. Further, by the low pass filter 109, the output of the feedback circuit block 106 becomes an output obtained by extracting only the offset voltage and the low-band noise component.

Therefore, a folding noise, a ripple noise and the like are generated in the process of the low offset compensation of the amplifier circuit 105, and even when the noise level on the high-band side rises, the negative feedback of the signal component in the band of the low pass filter 109 or more is not applied. Consequently, a high-band noise level of the amplifier circuit of FIG. 1 is not affected by the noise of the amplifier circuit 105, but is to be decided by only a thermal noise level of the amplifier circuit 103 in this configuration.

Figure 9:
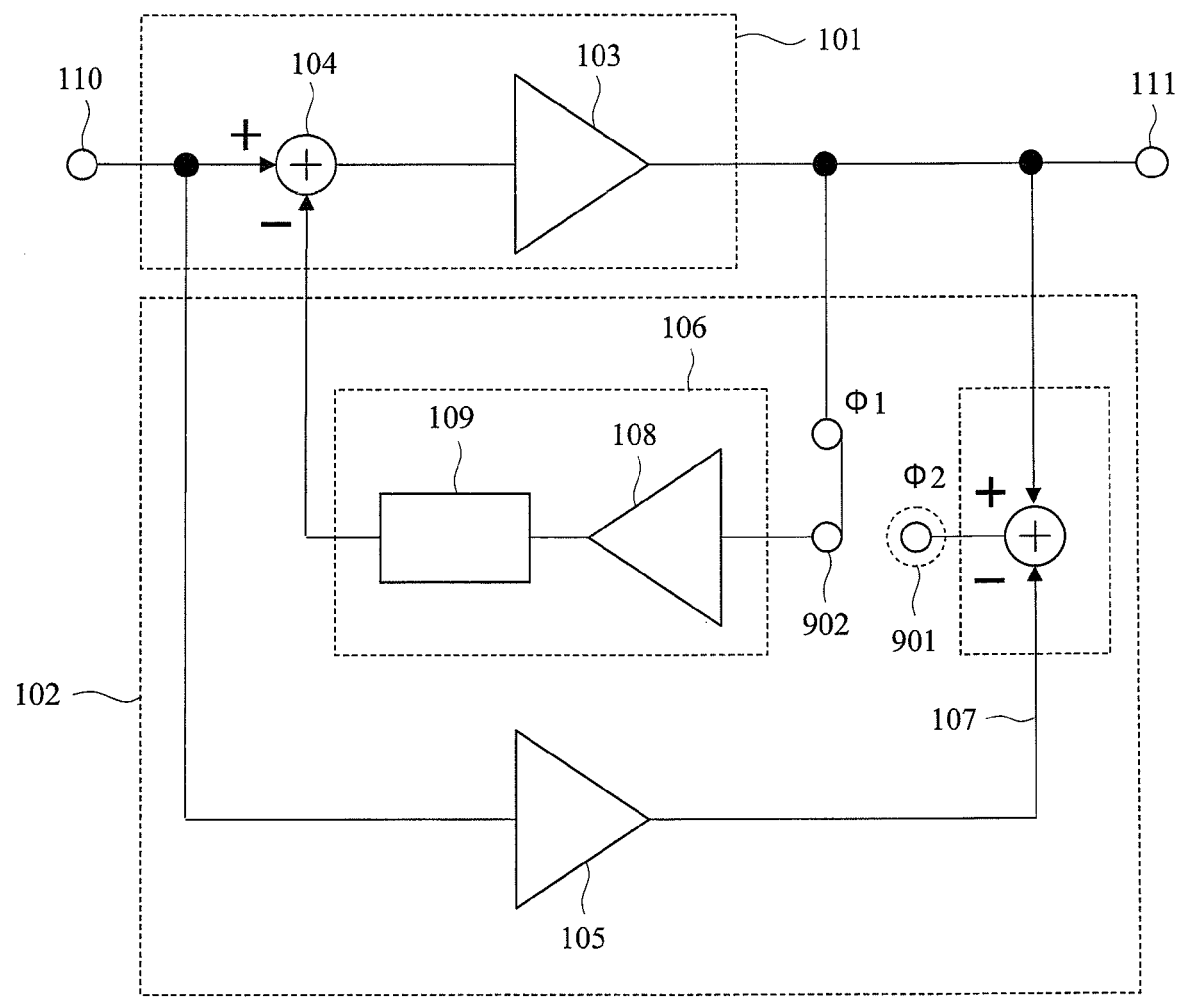
FIG. 9 is a circuit diagram showing a configuration example in the case where gain adjustment is performed in an amplifier circuit according to an embodiment of the present invention.
Figure 10:
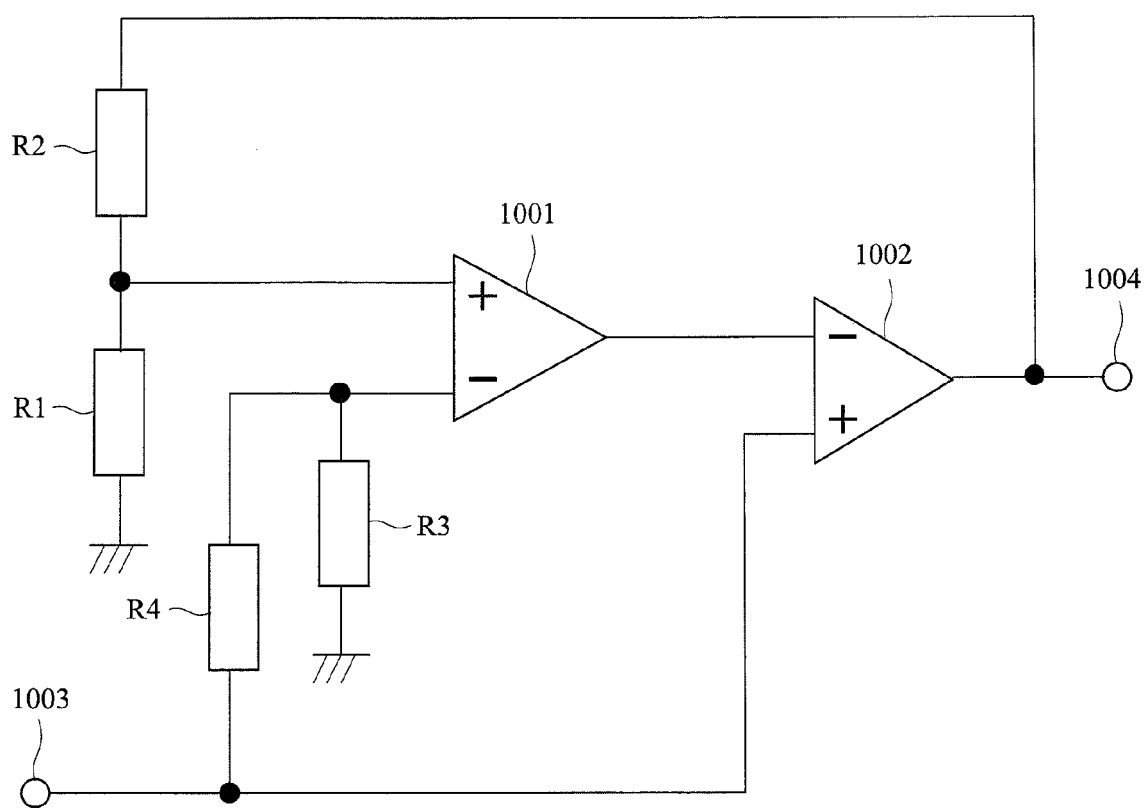
FIG. 10 is a circuit diagram showing a configuration example of the amplifier circuit according to the conventional technology.
Figure 11:
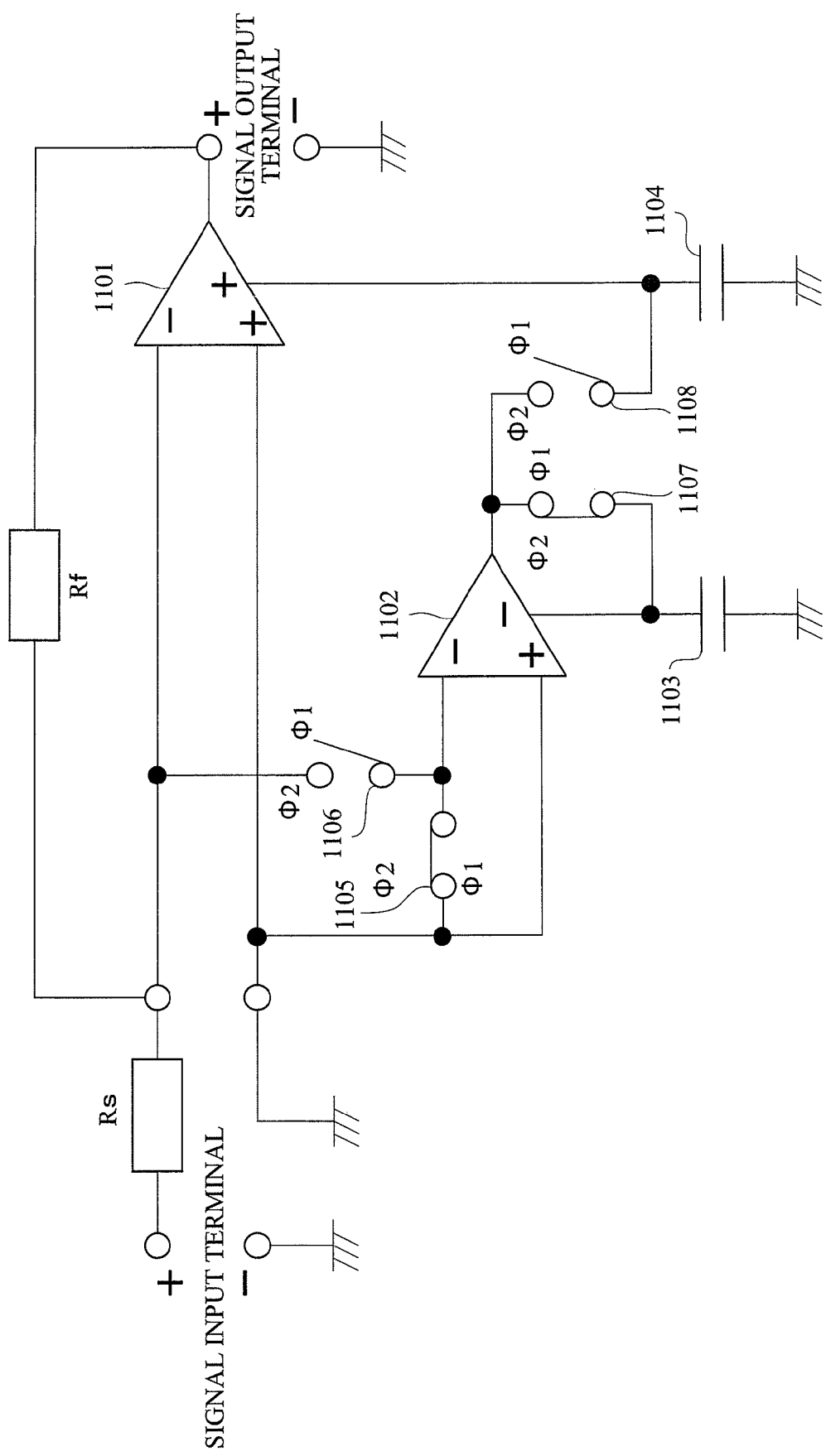
FIG. 11 is a circuit diagram showing another configuration example of the amplifier circuit according to the conventional technology.

Next, FIG. 9 shows an embodiment relative to an adjustment method in the case where a gain difference of the amplifier circuits 103 and 105 needs to be adjusted. The amplifier circuit shown in FIG. 9 is obtained by adding a switch 902 to the configuration example of FIG. 1, and at the time of gain adjustment, the switch 902 can be switched from the Φ2 to the Φ1. At the time of gain adjustment, when a signal Vh sufficiently faster than the band of the low pass filter 109 is input to the input signal node 110 as a test signal, a signal Vm at a differential signal monitor node 901 is expressed by formula 3 below.

$$Vm = \frac{G1}{1 + G1G3H(\omega)}(Vh + Voff1) - G2Vh \approx (G1 - G2)Vh \quad \text{[Formula 3]}$$

Here, since the signal of the high-band is handled, the voltage offset of the amplifier circuit 103 is disregarded, and the characteristic of the low pass filter 109 is set as $H(\omega)=0$. By giving a high-frequency test signal and adjusting the gain of the amplifier circuit 103 or 105 so that Vm becomes 0 V, it is possible to avoid the influence by the gain difference in the amplifier circuit of FIG. 1 (FIG. 9).

As an example of the amplifier circuit 105 with a small voltage offset, a chopper amplifier circuit or an auto-zero amplifier circuit can be employed.

Second Embodiment

Figure 3:
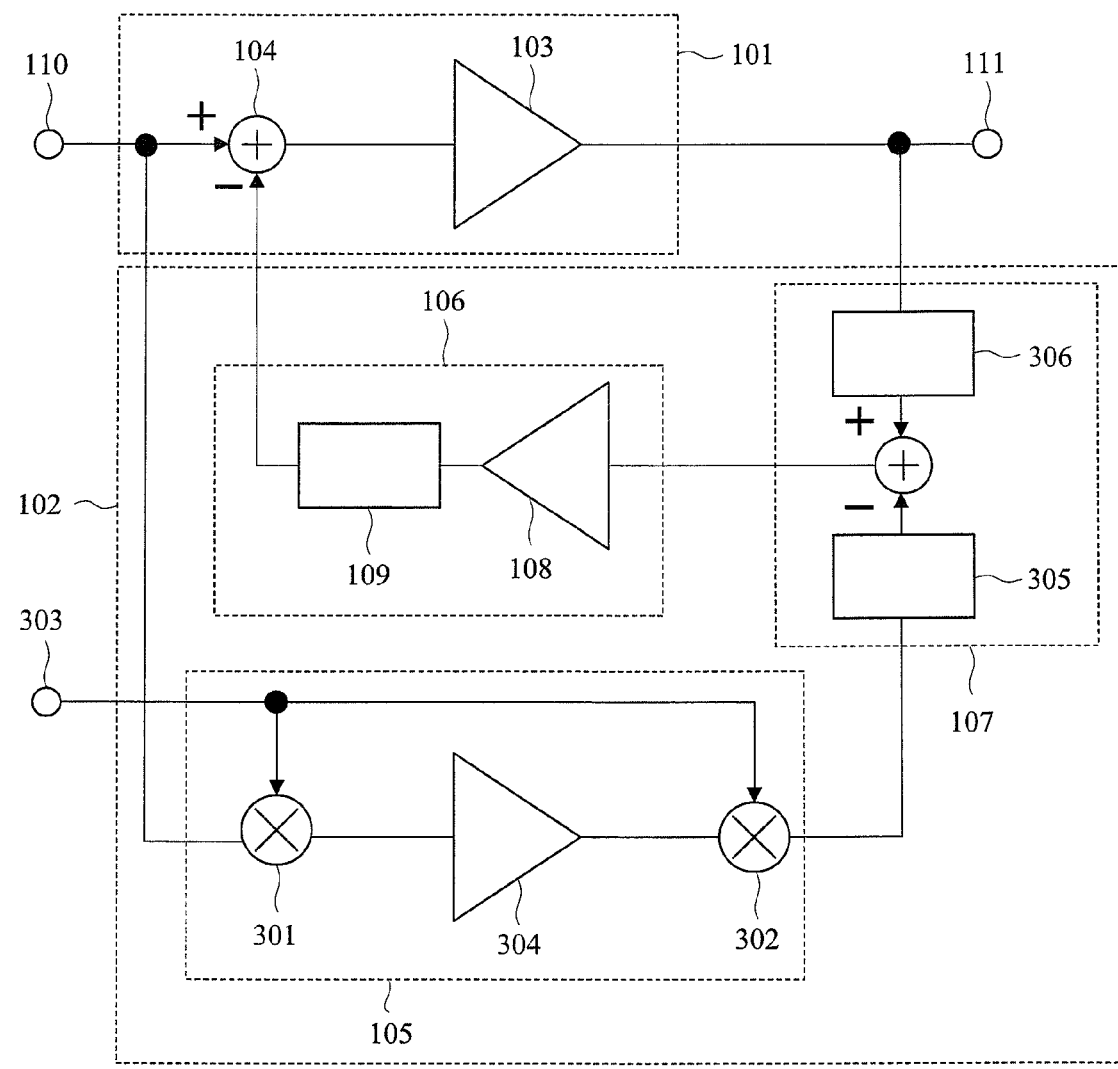
FIG. 3 is a circuit diagram showing a configuration example of an amplifier circuit according to a second embodiment of the present invention.

FIG. 3 is a circuit diagram showing a configuration example of an amplifier circuit according to a second embodiment of the present invention. The amplifier circuit shown in FIG. 3 has a configuration example obtained by using a chopper amplifier circuit for the amplifier circuit 105 of FIG. 1. The chopper amplifier circuit is formed by combining two sets of chopper modulators 301 and 302 before and after the amplifier circuit 304, and an input signal from the input signal node 110 and an input offset of the amplifier circuit 304 are periodically modulated in accordance with the modulation signal of a chopper frequency fc input from an input node 303.

At this time, the input signal is modulated to the high band side by the frequency fc by the chopper modulator 301 of an initial stage, and the chopper modulation signal is amplified by the amplifier circuit 304. Thereafter, the amplified chopper modulation signal is demodulated to a signal component of the original frequency band by the chopper modulator 302 of the latter stage. On the other hand, the input offset of the amplifier circuit 304 is amplified as it is, and thereafter, it is modulated to the high band side by the frequency fc by the chopper modulator 302, and this modulated offset voltage is removed by a low pass filter 305 in the analog adder block 107. At this time, not only the offset voltage but also the frequency component below the chopper frequency of the 1/f noise are modulated to the high band side by the frequency fc, and therefore, the 1/f noise is also removed by the low pass filter 305. Consequently, in the chopper amplifier circuit, the low-offset and low-noise amplification can be achieved.

Here, when the chopper amplifier circuit is applied, as shown in the analog adder block 107 of FIG. 3, a low pass filter 306 having the same frequency characteristic as the low pass filter 305 is provided also on the amplifier circuit 103 side. By this means, when the differential signal between the output signal of the amplifier circuit 103 and the output signal of the amplifier circuit 105 is detected in the analog adder block 107, each output signal can be compared in the same band component. Therefore, the amplifier circuit 105 is allowed if it has the gain characteristic equal to the amplifier circuit 103 within the passbands of the low pass filters 305 and 306. As the example thereof, the amplifier circuit 304 and the amplifier circuit 103 may be the same circuits.

Note that, since the chopper amplifier circuit is unable to amplify the signal component below the chopper frequency, a wideband operation is difficult when it is used alone. However, when the chopper amplifier circuit is used in combination with the amplifier circuit block 101 like the configuration example of FIG. 3, since an amplifiable operation band is decided by only the operation band of the amplifier circuit 103, the wideband operation becomes possible. At this time, although the chopper amplifier circuit generates a ripple noise by the chopper modulation signal, the noise component of the high band side does not affect the amplifier circuit 103 owing to the low pass filter 109. In other words, when the configuration example of FIG. 3 is used, the noise component of the high band side becomes a relatively small one which is decided by the thermal noise of the amplifier circuit 103, and further, a low offset and a low noise can be achieved on the low-band side because the negative feedback is applied by the differential signal with the amplifier circuit 105. Consequently, as a whole, an amplifier circuit with a low offset and a low noise having the gain constant over the wide band can be realized.

Third Embodiment

Figure 2:
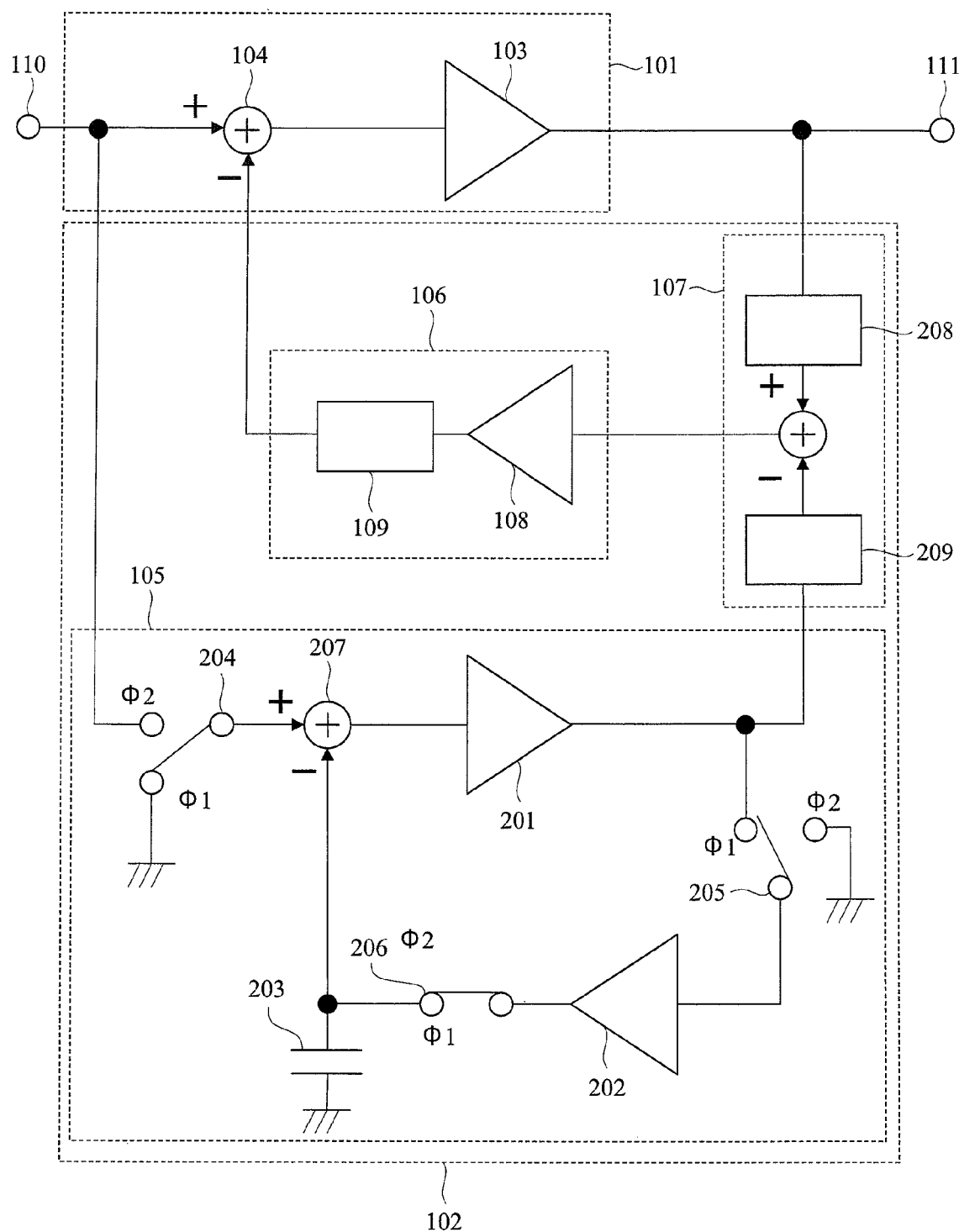
FIG. 2 is a circuit diagram showing a configuration example of an amplifier circuit according to a third embodiment of the present invention.

FIG. 2 is a circuit diagram showing a configuration example of an amplifier circuit according to a third embodiment of the present invention. The amplifier circuit shown in FIG. 2 has a configuration example obtained by applying an auto-zero amplifier circuit to the amplifier circuit 105 of FIG. 1. The auto-zero amplifier circuit is a low offset amplifier circuit using a sampling, and is constituted of an amplifier circuit 201 for input signal amplification, an amplifier circuit 202 for auto-zero control, a sampling capacitor 203, and switches 204, 205 and 206 for selecting two operation modes of an auto-zero operation mode and an amplification operation mode.

In the auto-zero operation mode, each of the switches 204, 205 and 206 of FIG. 2 is closed to the Φ1 side, and the input offset voltage and the 1/f noise of the amplifier circuit 201 are detected and accumulated in the sampling capacitor 203. In the amplification operation mode, each of the switches 204, 205 and 206 is closed to the Φ2 side, and the input offset and the 1/f noise accumulated in the sampling capacitor 203 in the auto-zero operation mode are subtracted from the input signal. By this means, the low-offset and low-noise amplification becomes possible. Here, when the input signal input to the amplifier circuit 105 is defined as Vi, the output of the amplifier circuit 105 is defined as VAZ, the gain of the amplifier circuit 201 is defined as G21, the gain of the amplifier circuit 202 is defined as G22, and the input offset voltage of the amplifier circuit 201 is defined as Voff21, a compensation voltage Vh held in the sampling capacitor 203 in the auto-zero operation mode is expressed by the formula 4 below.

$$Vh = \frac{G_{21}G_{22}V_{off21}}{1+G_{21}G_{22}} \approx V_{off21} \quad \text{[Formula 4]}$$

From the formula (4), when the gains of G21 and G22 are sufficiently large, the input offset voltage of the amplifier circuit 201 is approximately held in the sampling capacitor 203. Next, the output voltage VAZ of the amplifier circuit 105 in the amplification operation mode is expressed by the formula 5 below.

$$VAZ = G_{21}\left(V_i + \frac{V_{off21}}{1+G_{21}G_{22}}\right) \approx G_{21}\left(V_i + \frac{V_{off21}}{G_{21}G_{22}}\right) \quad \text{[Formula 5]}$$

From the formula (5), in the auto-zero amplifier circuit, the input offset voltage is compressed by G21×G22, and the low offset can be realized.

Note that, when the auto-zero amplifier circuit is applied, it is necessary to detect the differential signal between the amplifier circuit 105 and the amplifier circuit 103. Therefore, in order to perform the signal comparison easily, the same circuit as the amplifier circuit 103 is used for the amplifier circuit 201. In the auto-zero amplifier circuit, a continuous amplification is not possible because the operation mode is separated into two modes. In FIG. 2, however, continuation of the signal is achieved by providing the low pass filter 209 in the analog adder block 107. Further, when the auto-zero amplifier circuit is to be applied, the low pass filter 208 with the same frequency characteristic as that of the low pass filter 209 is provided in the analog adder block 107 so as to correspond to the amplifier circuit 103. By this means, when the differential signal of the output signals of the amplifier circuits 103 and 105 is detected in the analog adder block 107, the comparison can be performed in the same band component.

Further, in the auto-zero amplifier circuit, since the output signal has a discrete waveform, a power loss occurs and the output signal having a continuous waveform through the low pass filter is reduced compared with the gain from the amplifier circuit 103. Hence, an attenuator to match the gains of the amplifier circuits 103 and 105 is also included in the low pass filter 208. Supposing that the gain adjustment is performed, the output voltage VO in the configuration example of FIG. 2 is expressed by the formula 6 below.

$$V_O = G_1\left(V_{IN} + \frac{V_{off1}}{1+G_1G_3} - \frac{G_3V_{off21}}{G_{22}(1+G_1G_3)}\right) \approx \\ G_1\left(V_{IN} + \frac{V_{off1}}{G_1G_3} - \frac{V_{off21}}{G_1G_{22}}\right) \quad \text{[Formula 6]}$$

From the formula (6), the input offset voltage of the amplifier circuit 103 is compressed by G1G3, and the input offset voltage of the amplifier circuit 201 is compressed by G1G22, so that the low offset can be realized. Note that, when the auto-zero amplifier circuit is used alone, the continuous amplification is not possible, and an amplifiable signal band is narrowed because the operation band is decided by the sampling frequency. However, when the auto-zero amplifier circuit is used in combination with the amplifier circuit block 101 like the configuration example of FIG. 2, the noise level of the low-band side is compensated by the auto-zero amplifier circuit 105, and the negative feedback is not applied to the high-band side and the amplifiable operation band is decided by only the operation band of the amplifier circuit 103. Therefore, the continuous amplification and the wideband signal amplification can be realized.

Note that, though the same circuits are used for the amplification circuit 201 and the amplification circuit 103 here, they are not necessarily to be the same, and any circuits may be employed if they have equal gain characteristics in the passbands of the low pass filters 208 and 209. Further, for example, it is also possible to design the amplifier circuit 201 so as to have the gain characteristic slightly larger than the gain characteristic of the amplifier circuit 103 in advance without providing the attenuator in the low pass filter 208.

Fourth Embodiment

Figure 4:
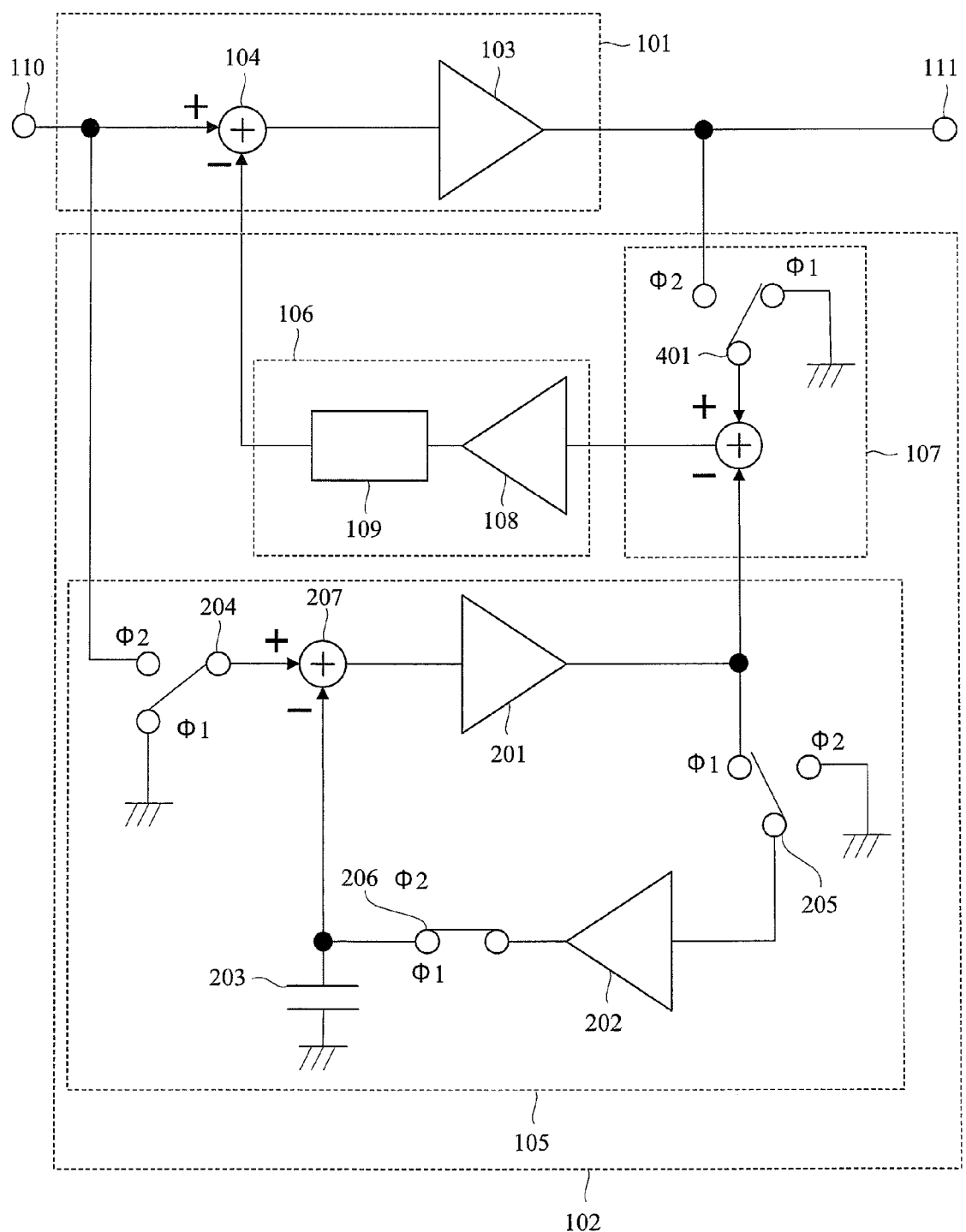
FIG. 4 is a circuit diagram showing a configuration example of an amplifier circuit according to a fourth embodiment of the present invention.

FIG. 4 is a circuit diagram showing a configuration example of an amplifier circuit according to a fourth embodiment of the present invention. The amplifier circuit shown in FIG. 4 has a configuration example in which the same auto-zero amplifier circuit as that in FIG. 2 is applied to the amplifier circuit 105 of FIG. 1, and further, a switch 401 is provided on the output side of an amplifier circuit 103 in the analog adder block 107, thereby discretizing the detection of the differential signal. The switch 401 is connected to the Φ1 side at the time of the auto-zero operation mode in which the input signal does not enter the amplifier circuit (auto-zero amplifier circuit) 105 and is connected to the Φ2 side at the time of the amplification operation mode. Therefore, the detection of the differential signal is not performed at the time of the auto-zero operation mode, and the detection of the differential signal is performed at the time of the amplification operation mode, and this differential signal applies the negative feedback to the amplifier circuit 103 through a feedback circuit block 106 in this configuration. With the configuration, since the low pass filters 208 and 209 shown in FIG. 2 and the attenuator in the low pass filter 208 can be eliminated, the reduction in area can be achieved.

Fifth Embodiment

Figure 5:
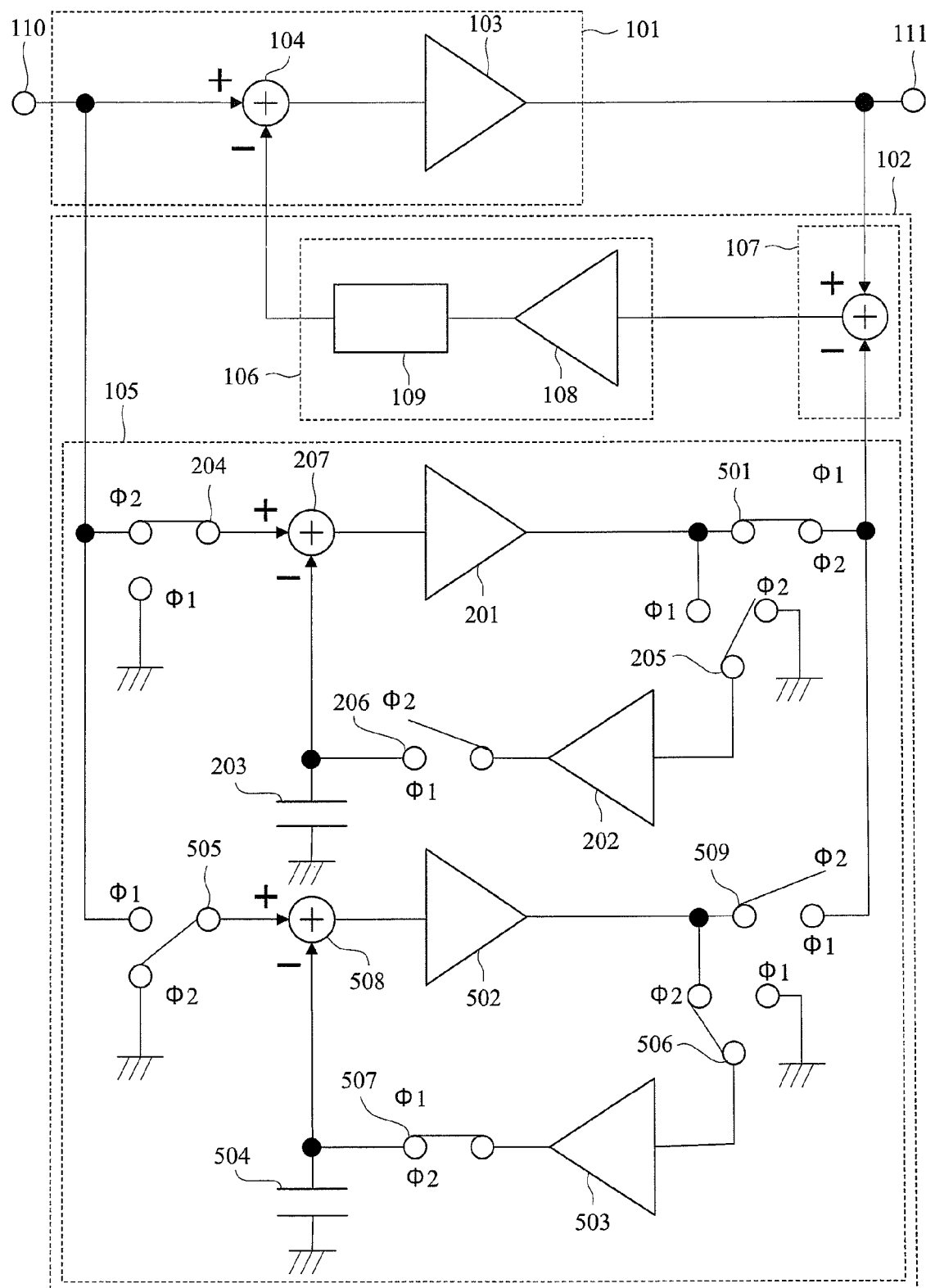
FIG. 5 is a circuit diagram showing a configuration example of an amplifier circuit according to a fifth embodiment of the present invention.

FIG. 5 is a circuit diagram showing a configuration example of an amplifier circuit according to a fifth embodiment of the present invention. The amplifier circuit shown in FIG. 5 is a configuration example obtained by applying a Ping-Pong type auto-zero amplifier circuit to the amplifier circuit 105 of FIG. 1. The Ping-Pong type auto-zero amplifier circuit mentioned here has a configuration in which the auto-zero amplifier circuits of the same characteristic are disposed in parallel in two stages, and the input signals are input to the two auto-zero amplifier circuits through the switches 204 and 505.

Each auto-zero amplifier circuit operates so that the auto-zero operation mode and the amplification operation mode are performed in an opposite manner by each switch. For example, when each of the switches 204 to 206, 501, 505 to 507 and 509 is connected to the Φ1, the auto-zero amplifier circuit including the amplifier circuits 201 and 202 operates in the auto-zero mode, and the auto-zero amplifier circuit including the amplifier circuits 502 and 503 operates in the signal amplification mode in a state where an offset compensation is made by the sampling capacitor 504 and the analog adder 508. Therefore, the output of the amplifier circuit 105 obtained from the two auto-zero amplifier circuits through the switches 501 and 509 always becomes the output in the signal amplification mode, and thus the continuous amplification is possible unlike the single auto-zero amplifier circuit. As described above, by applying the Ping-Pong type auto-zero amplifier circuit, the low pass filter 209 for restoring the discrete waveform as shown in FIG. 2 to a continuous waveform can be eliminated, and as a result, the low pass filter 208 and the attenuator in the filter can be also eliminated. Consequently, the area of the analog adder block 107 can be reduced.

Sixth Embodiment

Figure 6:
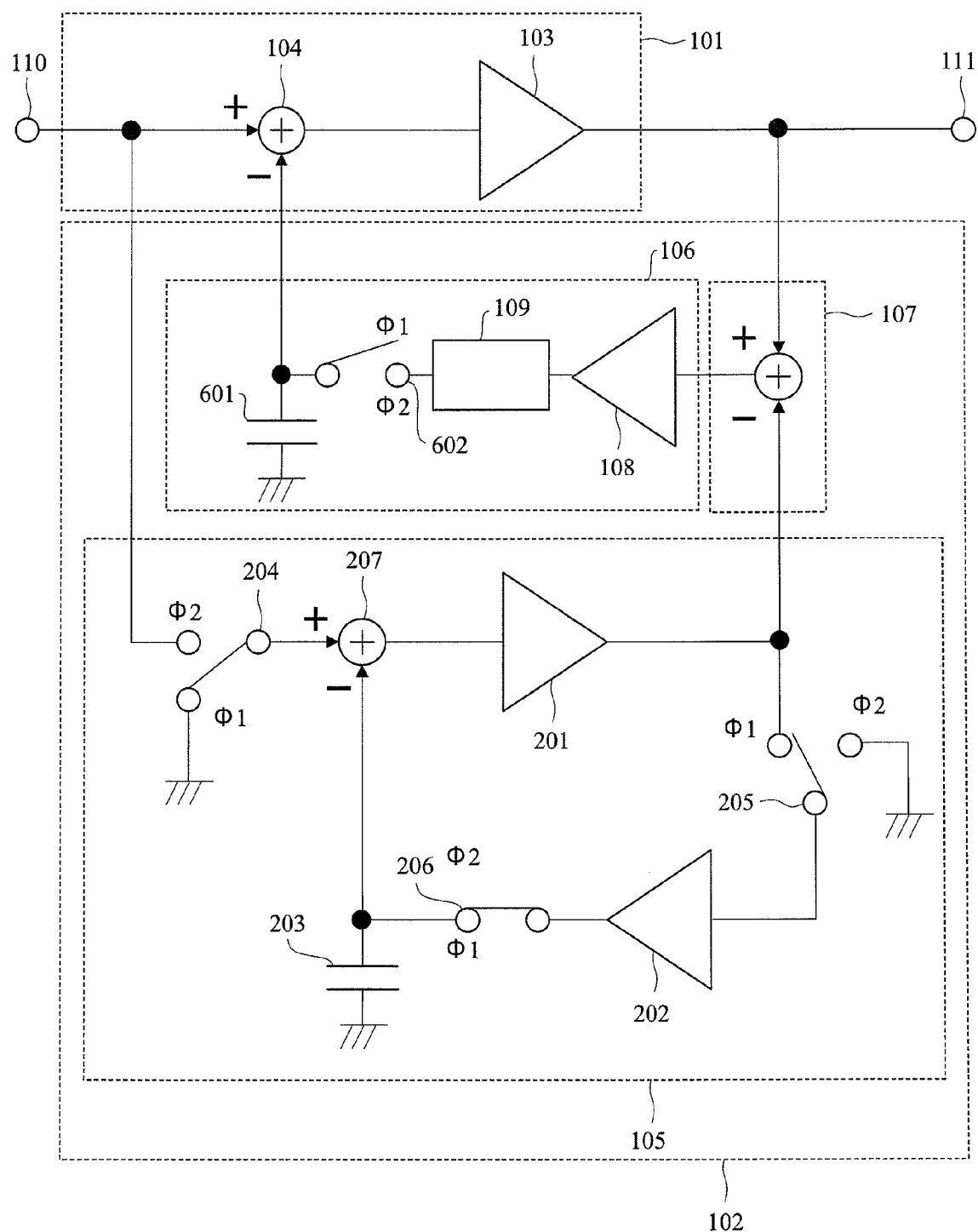
FIG. 6 is a circuit diagram showing a configuration example of an amplifier circuit according to a sixth embodiment of the present invention.

FIG. 6 is a circuit diagram showing a configuration example of an amplifier circuit according to a sixth embodiment of the present invention. The amplifier circuit shown in FIG. 6 has a configuration example in which an auto-zero amplifier circuit is applied to the amplifier circuit 105 of FIG. 1, and further, a switch 602 and a sampling capacitor 601 are provided in the feedback circuit block 106, thereby performing the offset compensation of the amplifier circuit 103 by using the output signal of the auto-zero amplifier circuit directly as a discrete signal.

When the auto-zero amplifier circuit 105 operates in an amplification operation mode, each of the switches 205 to 206 of FIG. 6 is closed to the Φ2 side, the amplifier circuit 103 is offset-compensated by the negative feedback applied through an analog adder 104, and an offset voltage and a low-band noise component detected by an analog adder block 107 are held in the sampling capacitor 601. When the auto-zero amplifier circuit 105 operates in an auto-zero operation mode, each of the switches 205 to 206 of FIG. 6 is closed to the Φ1 side, and as a result, no negative feedback is applied. However, since the component of the differential signal is held in the sampling capacitor 601 in this period as described above, the offset compensation of the amplifier circuit 103 is continuously performed, and at the same time, the offset compensation of the auto-zero amplifier circuit 105 is performed.

Seventh Embodiment

Figure 7:
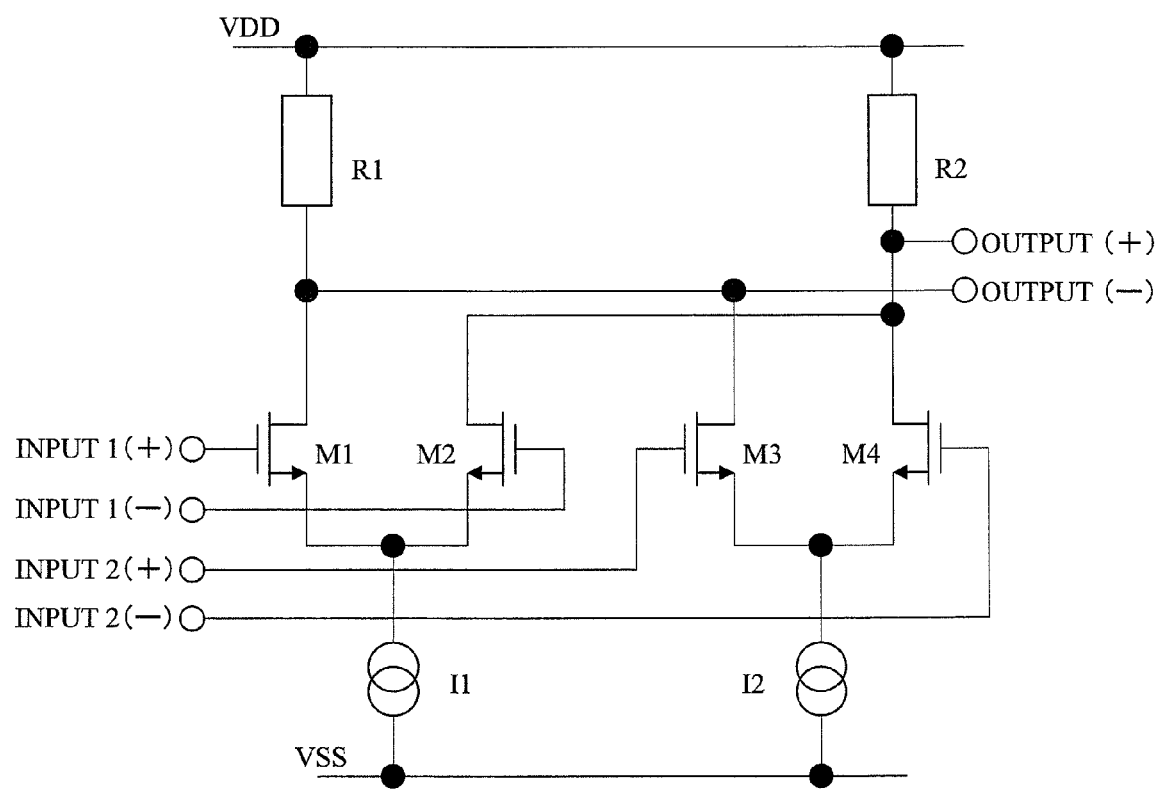
FIG. 7 is a circuit diagram showing a detailed configuration example of an analog adder used in an amplifier circuit according to a seventh embodiment of the present invention.
Figure 8:
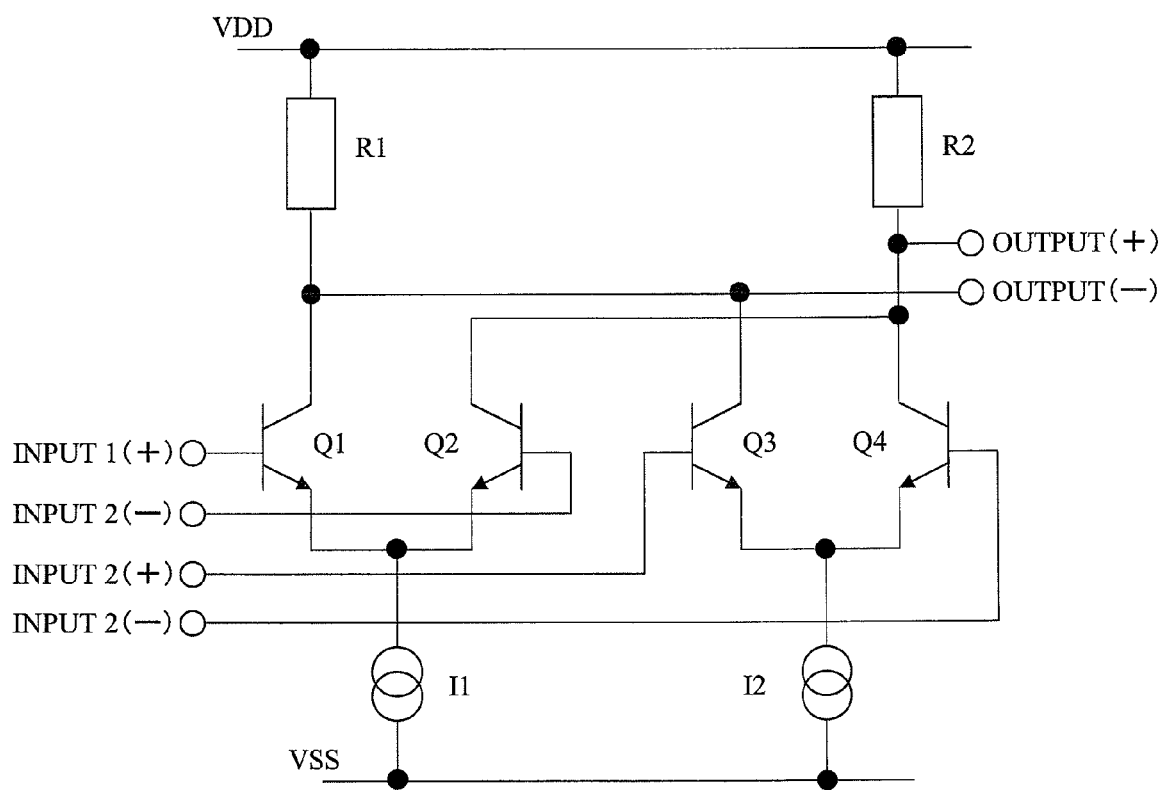
FIG. 8 is a circuit diagram showing another detailed configuration example of an analog adder used in the amplifier circuit according to the seventh embodiment of the present invention.

In a seventh embodiment, the configuration example of the circuit in a part of each of the amplifier circuits shown above will be described in detail. The amplifier circuits shown in FIG. 1 to FIG. 6 can be applied not only to a single end signal but also to a differential signal. FIG. 7 is a circuit diagram showing a detailed configuration example of the analog adder used in the amplifier circuit according to the seventh embodiment of the present invention. FIG. 8 is a circuit diagram showing another detailed configuration example of the analog adder used in the amplifier circuit according to the seventh embodiment of the present invention.

The analog adder shown in FIG. 7 has a differential configuration, in which differential signals input to MOS transistors M1 and M2 to be a differential pair from (+) and (−) of the inputs 1 and differential signals input to MOS transistors M3 and M4 to be a differential pair from (+) and (−) of the inputs 2 are subjected to the voltage addition through load resistors R1 and R2, and the result thereof is output to the outputs (+) and (−). At this time, although the offset voltage is generated due to the variation in the MOS transistors M1 and M2, M3 and M4 and the load resistors R1 and R2, the offset voltage can be reduced by using each amplifier circuit described in the first to sixth embodiments.

The amplifier circuits described in the first to sixth embodiments can all be mounted by a standard CMOS process. However, since the amplifier circuits shown in FIG. 1 to FIG. 5 have no capacitor and switch used immediately before the analog adder 104, there is no need to consider the effect of a base current, and for this reason, the analog adder 104 and the amplifier circuit 103 can be mounted by using bipolar transistors having less noise instead of the MOS transistors. For example, as shown in FIG. 8, the analog adder 104 is configured so that the MOS transistors M1 to M4 of FIG. 7 are replaced by the bipolar transistors Q1 to Q4, and further, though not illustrated, the amplifier circuit 103 is also formed by using the bipolar transistors.

Figure 12:
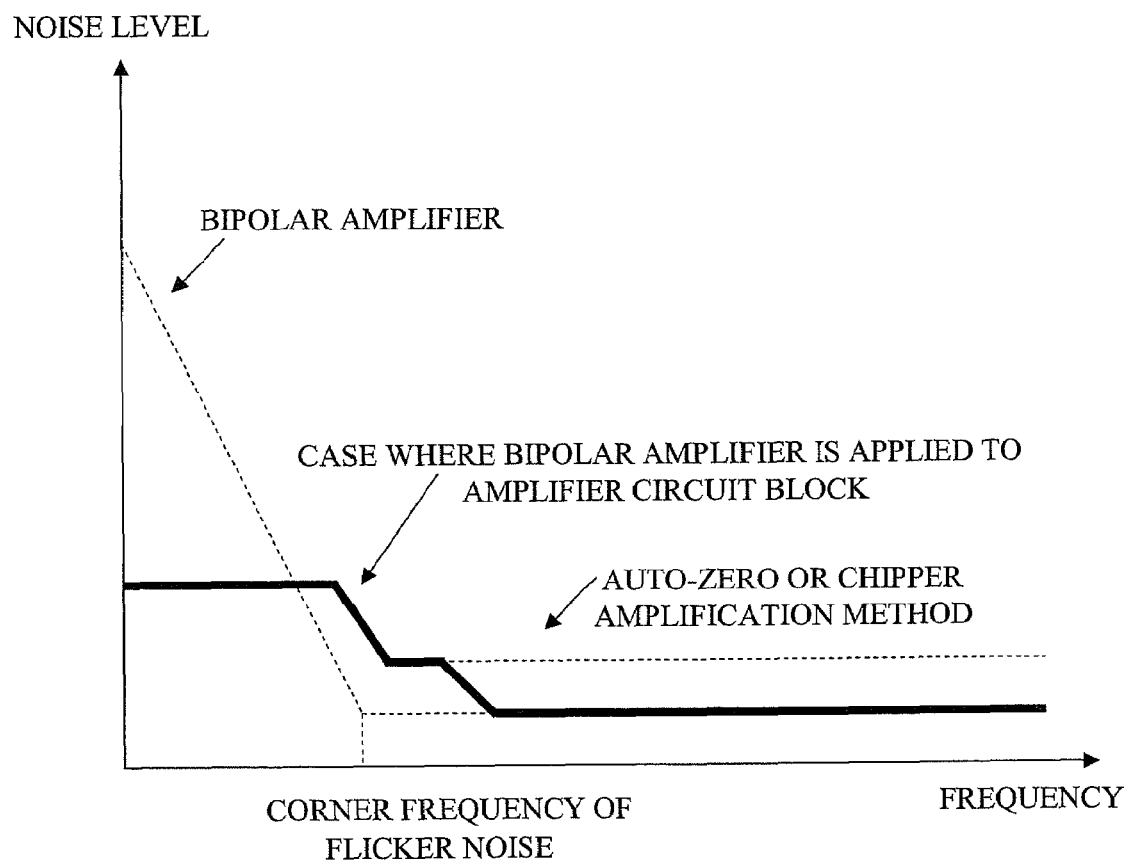
FIG. 12 is a graph showing an example of the noise characteristic of the amplifier circuit in an amplifier circuit according to an embodiment of the present invention.

FIG. 12 is a graph showing an example of the noise characteristic of the amplifier circuit. As shown by the noise characteristic of FIG. 12, by using the bipolar transistors to mount the analog adder 104 and the amplifier circuit 103, a level of the thermal noise determining the noise level of the high band side can be reduced compared with a case where MOS transistors are used to mount the same. In other words, in addition to the reduction of the offset voltage and the noise level on the low-band side, the reduction of the noise level on the high-band side can also be achieved by using the bipolar transistors for the amplifier circuit block 101 in the circuit system described in FIG. 1 to FIG. 5. Consequently, in comparison to the case where all the circuits are mounted by using the MOS transistors, the noise can be further reduced over the wide band.

Thus, the main effects obtained by using the amplifier circuits of the first to seventh embodiments described above can be summed up as follows.

(1) For the wideband signal component, the input signal can be always amplified with the gain of the same amplifier circuit. Therefore, a stable gain can be obtained over the entire operation band to be handled.

(2) The differential signal of each output signal of the amplifier circuit with a large offset voltage and wide operation band and the amplifier circuit with a narrow operation band and small offset voltage is detected, and the differential signal thereof is negatively fed back to the amplifier circuit. Therefore, the input offset voltage and the low-band noise of the amplifier circuit can be reduced.

(3) Since no capacitor and switch is required for the input of the amplifier circuit for performing amplification, the amplifier circuit which is not offset-compensated can be mounted by using the bipolar transistors, and the amplifier circuit serving as a standard of the low offset can be mounted by the CMOS process. Therefore, the input offset voltage and the low-band noise of the bipolar amplifier circuit can be reduced without using the trimming.

In the foregoing, the invention made by the inventors of the present invention has been concretely described based on the embodiments. However, it is needless to say that the present invention is not limited to the foregoing embodiments and various modifications and alterations can be made within the scope of the present invention.

An amplifier circuit with a low offset voltage and a low noise capable of amplifying a wideband signal component according to the present invention can be applied to the amplifier circuits for tape drive, medical equipment and biosensor or to the wideband signal amplification including a direct current component such as the amplification of PCM signals.

What is claimed is:

1. An amplifier circuit, comprising: an amplifier circuit block; and a compensation circuit block,
   wherein the amplifier circuit block includes:
   a first analog adder which subtracts an output signal of the compensation circuit block from a first input signal; and
   a first amplifier circuit which operates in a wide band and amplifies an output signal of the first analog adder, and
   the compensation circuit block includes:
   a second amplifier circuit which amplifies the first input signal and has characteristics of a low offset voltage and low-band noise compared with the first amplifier circuit;
   an analog adder block which subtracts an output signal of the second amplifier circuit from an output signal of the first amplifier circuit and outputs a differential signal between the first amplifier circuit and the second amplifier circuit; and
   a feedback circuit block which negatively feeds back the differential signal toward the first analog adder.

2. The amplifier circuit according to claim 1,
   wherein a gain of the second amplifier circuit is equal to a gain of the first amplifier circuit.

3. The amplifier circuit according to claim 1,
   wherein the feedback circuit block includes:
   a third amplifier circuit which amplifies the differential signal from the analog adder block; and
   a first low pass filter which imposes a band limitation on an output signal of the third amplifier circuit.

4. The amplifier circuit according to claim 1,
   wherein the second amplifier circuit is a chopper amplifier circuit having a function to separate a component of the first input signal and components of the low offset voltage and the low-band noise by using modulation and demodulation.

5. The amplifier circuit according to claim 1,
   wherein the second amplifier circuit holds its own offset voltage and low-band noise component in a capacitor at the time of an auto-zero operation, and has a function to negatively feed back the voltage held in the capacitor to its own input at the time of an input signal amplifying operation.

6. The amplifier circuit according to claim 5,
   wherein the second amplifier circuit includes first and second auto-zero amplifier circuits provided in parallel between a first input node to which the first input signal is input and the analog adder block,
   each of the first and second auto-zero amplifier circuits includes:
   first, second, third and fourth switches;
   a first amplifier circuit which performs an output to the analog adder block through the fourth switch;
   a second amplifier circuit to which an output signal of the first amplifier circuit is input through the second switch;
   a first capacitor which holds an offset voltage and a low-band noise component of the first amplifier circuit when an output signal of the second amplifier circuit is input through the third switch; and
   a third analog adder which subtracts a held voltage of the first capacitor for the first input signal input from the first input node through the first switch and outputs the subtraction result to the first amplifier circuit,
   at the time of the auto-zero operation, one input of the third analog adder is fixed to a ground voltage by the first switch, the output signal of the first amplifier circuit is input to the second amplifier circuit by the second switch, the output signal of the second amplifier circuit is held in the first capacitor by the third switch, and the output of the first amplifier circuit is disconnected with the analog adder block by the fourth switch,
   at the time of an input signal amplification operation, the first input signal is input to one input of the third analog adder by the first switch, an input of the second amplifier circuit is fixed to the ground voltage by the second switch, the output of the second amplifier circuit is disconnected with the first capacitor by the third switch, and the output signal of the first amplifier circuit is input to the analog adder block by the fourth switch, and when one of the first auto-zero amplifier circuit and the second auto-zero amplifier circuit performs the auto-zero operation, the other performs the input signal amplification operation.

7. The amplifier circuit according to claim 6,
wherein the analog adder block is constituted of a second analog adder which has one input node connected to an output node of the first amplifier circuit and the other input node connected to an output node of the second amplifier circuit and outputs a differential signal between the output signal of the first amplifier circuit and the output signal of the second amplifier circuit.

8. The amplifier circuit according to claim 1,
wherein the amplifier circuit is formed by a CMOS process.

9. The amplifier circuit according to claim 1,
wherein the amplifier circuit block is formed by a bipolar process.

10. The amplifier circuit according to claim 1,
wherein the amplifier circuit further includes a first switch for connecting an input node of the feedback circuit block to an output node of the first amplifier circuit or an output node of the analog adder block, and
the amplifier circuit is configured so that the output node of the analog adder block can be monitored in a state where the first switch is being connected to an output node side of the first amplifier circuit.

11. An amplifier circuit, comprising: an amplifier circuit block; and a compensation circuit block,
wherein the amplifier circuit block includes:
a first analog adder which subtracts an output signal of the compensation circuit block from a first input signal; and
a first amplifier circuit which operates in a wide band and amplifies an output signal of the first analog adder,
the compensation circuit block includes:
a second amplifier circuit which amplifies the first input signal and has characteristics of a low offset voltage and a small low-band noise compared with the first amplifier circuit;
an analog adder block which subtracts an output signal of the second amplifier circuit from an output signal of the first amplifier circuit and outputs a differential signal between the first amplifier circuit and the second amplifier circuit; and
a feedback circuit block which negatively feeds back the differential signal toward the first analog adder, and
the second amplifier circuit includes:
a first chopper modulator which chopper-modulates the first input signal in accordance with a predetermined control signal and outputs a chopper modulation signal;
an amplifier circuit which amplifies the chopper modulation signal output from the first chopper modulator; and
a second chopper modulator which demodulates the chopper modulation signal amplified by the amplifier circuit.

12. The amplifier circuit according to claim 11,
wherein the analog adder block includes:
a first low pass filter which imposes a band limitation on the output signal of the second amplifier circuit;
a second low pass filter which has the same frequency characteristic as the first low pass filter and imposes a band limitation on the output signal of the first amplifier circuit; and
a second analog adder block which receives respective output signals of the first and second low pass filters as input signals and outputs a differential signal.

13. The amplifier circuit according to claim 12,
wherein a gain of the amplifier circuit in a pasaband of the second low pass filter is equal to a gain of the first amplifier circuit in a pasaband of the third low pass filter.

14. An amplifier circuit, comprising: an amplifier circuit block; and a compensation circuit block,
wherein the amplifier circuit block includes:
a first analog adder which subtracts an output signal of the compensation circuit block from a first input signal; and
a first amplifier circuit which operates in a wide band and amplifies an output signal of the first analog adder,
the compensation circuit block includes:
a second amplifier circuit which amplifies the first input signal and has characteristics of a low offset voltage and a small low-band noise compared with the first amplifier circuit;
an analog adder block which subtracts an output signal of the second amplifier circuit from an output signal of the first amplifier circuit and outputs a differential signal between the first amplifier circuit and the second amplifier circuit; and
a feedback circuit block which negatively feeds back the differential signal toward the first analog adder, and
the second amplifier circuit includes:
first, second and third switches;
a third amplifier circuit;
a fourth amplifier circuit to which an output signal of the third amplifier circuit is input through the second switch;
a first capacitor which holds an offset voltage and a low-band noise component of the third amplifier circuit when an output signal of the fourth amplifier circuit is input through the third switch; and
a third analog adder which subtracts a held voltage of the first capacitor from the first input signal input through the first switch and outputs the subtraction result to the third amplifier circuit,
at the time of the auto-zero operation, one input of the third analog adder is fixed to a ground voltage by the first switch, the output signal of the third amplifier circuit is input to the fourth amplifier circuit by the second switch, and the output signal of the fourth amplifier circuit is held in the first capacitor by the third switch, and
at the time of an input signal amplification operation, the first input signal is input to one input of the third analog adder by the first switch, an input of the third amplifier circuit is fixed to the ground voltage by the second switch, and the output of the fourth amplifier circuit is disconnected with the first capacitor by the third switch.

15. The amplifier circuit according to claim 14,
wherein the analog adder block includes:
a second analog adder which outputs a differential signal between two inputs;
a first low pass filter which is provided between one input of the second analog adder and the second amplifier circuit and performs an interpolation processing for a discrete output signal from the second amplifier circuit; and
a second low pass filter which is provided between the other input of the second analog adder and the first amplifier circuit, has the same frequency characteristic as the first low pass filter, and imposes a band limitation on the output signal of the first amplifier circuit.

16. The amplifier circuit according to claim 15,
wherein a gain of the third amplifier circuit in a passband of the second low pass filter is equal to a gain of the first amplifier circuit in a passband of the third low pass filter, and the analog adder block further includes: an attenuator which is provided between the other input of the second analog adder and the first amplifier circuit and lowers the gain of the first amplifier circuit in accordance with a gain drop of the second amplifier circuit due to the interpolation processing.

17. The amplifier circuit according to claim 14,
wherein the analog adder block includes:
a fourth switch; and
a second analog adder which has one input node to which the output signal of the second amplifier circuit is input and the other input node to which the output signal of the first amplifier circuit is input through the fourth switch and outputs the differential signal between the two input signals,
when the second amplifier circuit performs the auto-zero operation, the other input node of the second analog adder is fixed to the ground voltage by the fourth switch, and
when the second amplifier circuit performs the input signal amplification operation, the output signal of the first amplifier circuit is input to the other input node of the second analog adder by the fourth switch.

18. The amplifier circuit according to claim 14,
wherein the feedback circuit block further includes:
a fourth switch; and
a second capacitor which holds an output signal of a first low pass filter through the fourth switch,
during a time when the second amplifier circuit performs the input signal amplification operation, the output signal of the first low pass filter is held by the second capacitor by the fourth switch, and at the same time, the held voltage of the second capacitor is fed back to the first analog adder, and
during a time when the second amplifier circuit performs the auto-zero operation, an output of the first low pass filter is disconnected with the second capacitor by the fourth switch, and the held voltage of the second capacitor held during the input signal amplification operation is fed back to the first analog adder.

* * * * *